(12) United States Patent
Wittmann et al.

(10) Patent No.: US 12,345,092 B2
(45) Date of Patent: Jul. 1, 2025

(54) OPTOELECTRONIC LIGHTING DEVICE AND METHOD

(71) Applicant: ams-OSRAM International GmbH, Regensburg (DE)

(72) Inventors: Sebastian Wittmann, Regenstauf (DE); Andreas Dobner, Wenzenbach (DE)

(73) Assignee: ams-OSRAM International GmbH, Regensburg (DE)

( * ) Notice: Subject to any disclaimer, the term of this patent is extended or adjusted under 35 U.S.C. 154(b) by 0 days.

(21) Appl. No.: 18/284,627

(22) PCT Filed: Mar. 30, 2022

(86) PCT No.: PCT/EP2022/058370
§ 371 (c)(1),
(2) Date: Sep. 28, 2023

(87) PCT Pub. No.: WO2022/207683
PCT Pub. Date: Oct. 6, 2022

(65) Prior Publication Data
US 2024/0167331 A1    May 23, 2024

(30) Foreign Application Priority Data
Mar. 30, 2021   (DE) .................... 10 2021 108 003.7

(51) Int. Cl.
*E06B 9/24*     (2006.01)
*F21S 41/153*   (2018.01)
(Continued)

(52) U.S. Cl.
CPC .............. *E06B 9/24* (2013.01); *F21S 41/153* (2018.01); *F21S 41/285* (2018.01); *F21S 43/15* (2018.01);
(Continued)

(58) Field of Classification Search
CPC ........ F21S 41/153; F21S 41/285; F21S 43/15; F21S 43/26; E06B 9/24; E06B 2009/247
See application file for complete search history.

(56) References Cited

FOREIGN PATENT DOCUMENTS

| | | |
|---|---|---|
| CN | 102384447 A | 3/2012 |
| DE | 195 40 813 C1 | 9/1996 |

(Continued)

OTHER PUBLICATIONS

Innovation Q+ NPL Search (Year: 2024).*
(Continued)

*Primary Examiner* — Anabel Ton
(74) *Attorney, Agent, or Firm* — Hauptman Ham, LLP

(57) ABSTRACT

An optoelectronic lighting device includes a transparent pane, in particular a glass pane, on which a first at least partially transparent intermediate layer is arranged. The optoelectronic lighting device also includes at least one optoelectronic fiber arranged on the first intermediate layer and including at least one electrical line extending in a longitudinal direction and connected to a plurality of optoelectronic semiconductor components. The optoelectronic fiber includes a flexible support substrate on which the at least one electrical line and the plurality of optoelectronic semiconductor components are arranged. The optoelectronic lighting device further includes a second at least partially transparent intermediate layer, the second intermediate layer being arranged on the first intermediate layer and covering the at least one optoelectronic fiber.

20 Claims, 3 Drawing Sheets

(51) Int. Cl.
    *F21S 41/20* (2018.01)
    *F21S 43/15* (2018.01)
    *F21S 43/20* (2018.01)
    *H01L 25/16* (2023.01)
    *F21Y 115/10* (2016.01)
(52) U.S. Cl.
    CPC ............ *F21S 43/26* (2018.01); *H01L 25/167* (2013.01); *E06B 2009/247* (2013.01); *F21Y 2115/10* (2016.08)

(56) References Cited

FOREIGN PATENT DOCUMENTS

| DE | 10 2016 223 208 A1 | 5/2018 | | |
|---|---|---|---|---|
| DE | 11 2009 003 123 B4 | 2/2020 | | |
| EP | 2527722 A2 | * | 11/2012 | ............ F21S 43/237 |
| EP | 3342641 A1 | * | 7/2018 | ............ B60Q 1/268 |
| WO | 2007/045786 A1 | | 4/2007 | |
| WO | 2008/061789 A1 | | 5/2008 | |
| WO | 2012/098330 A1 | | 7/2012 | |
| WO | 2018/138074 A1 | | 8/2018 | |
| WO | 2020/011857 A1 | | 1/2020 | |

OTHER PUBLICATIONS

International Search Report issued for corresponding International Patent Application No. PCT /EP2022/058370, on Jun. 27, 2022, along with an English translation (6 pages).
Written Opinion issued for corresponding International Patent Application No. PCT /EP2022/058370, on Jun. 27, 2022 (8 pages).

* cited by examiner

OPTOELECTRONIC LIGHTING DEVICE AND METHOD

CROSS REFERENCE TO RELATED APPLICATION

This application is a National Stage of International Application No. PCT/EP2022/058370, filed on Mar. 30, 2022, which designates the United States and was published in Europe, and which claims priority to German Patent Application No. 10 2021 108 003.7, filed on Mar. 30, 2021, in the German Patent Office. All of the aforementioned applications are hereby incorporated by reference in their entireties.

The present invention is concerned with technologies for displaying information in or on a transparent pane or surface of a vehicle. In particular, the invention relates to a pane, window, panoramic roof glazing, headliner, or other surface of a vehicle, comprising optoelectronic semiconductor components, and wiring and control thereof, for displaying information or symbols on the pane, window, panoramic roof glazing, headliner, or other surface of the vehicle.

Although the invention mainly addresses windows, panoramic roof glazing, a headliner, and exterior surfaces of an automobile, it is not limited to this particular type of vehicle, but can alternatively be implemented in other types of vehicles, such as trains, buses, trucks, aircraft, or ships.

In addition, the subject matter of the present invention may also be used in the field of buildings and houses to display information in or on appropriately used panes, particularly glass panes.

BACKGROUND

The windows of a motor vehicle, especially a car, are usually made of laminated glass. Such laminated glass is used not only for windshields, but also to some extent for side windows, rear windows, sunroofs and panoramic roofs. Laminated glass is manufactured by joining two or more sheets of glass together by means of a thermoplastic bonding layer. In some cases, the thermoplastic layer is also applied to only one pane.

LEDs oriented to shine toward the interior of a motor vehicle, especially a car, are used to provide interior illumination or to provide information to the driver or another occupant of the vehicle. Light sources, such as front lights, rear lights, the high-mounted brake light, and additional brake lights or turn signals, that are oriented to shine outward, on the other hand, provide exterior illumination for the vehicle.

In the past, attempts have been made to integrate LED lighting as an integral part of vehicle components, for example to provide interior lighting for the vehicle. One approach, for example, is to integrate LEDs into the glazing of a vehicle, in particular into the thermoplastic bonding layer between two panes of glass.

At present, however, no solutions are known for integrating individual LEDs distributed over a large area ($\gg 1$ m$^2$) and with a relatively high spacing from one another, for example >2 cm, into the panes of a motor vehicle in a particularly cost-effective manner. If, for example, LEDs grown on a continuous monolithic substrate were to be integrated into the thermoplastic intermediate layer of such a laminated glass pane, the large area would result in high area costs and large unlit dead areas would cause unnecessary costs.

WO 2020011857 A1 describes an optoelectronic fiber that is easy to manufacture, in particular for integration into a textile fabric. The optoelectronic fiber is designed and dimensioned in such a way that it can be integrated into a textile, comparable to a textile thread, in particular using the usual weaving and/or knitting and/or embroidery techniques. The fiber has a very large length and can therefore be regarded as an endless fiber, so to speak.

There is a need to counteract the aforementioned problems and provide a window, or pane, of a vehicle that includes optoelectronic semiconductor components, and that is simple and inexpensive to manufacture.

SUMMARY OF THE INVENTION

This and other needs are met by an optoelectronic lighting device having the features of claim 1 and the method of manufacturing an optoelectronic lighting device having the features of claim 16. Embodiments and further embodiments of the invention are described in the dependent claims.

An optoelectronic lighting device according to the invention comprises a transparent pane, in particular a glass pane, on which a first at least partially transparent intermediate layer is arranged. Furthermore, the lighting device comprises at least one optoelectronic fiber arranged on the first intermediate layer and having at least one electrical line which extends in a longitudinal direction and which is connected to a plurality of optoelectronic semiconductor components. The optoelectronic fiber comprises a flexible support substrate on which the at least one electrical line and the plurality of optoelectronic semiconductor components are arranged. A second at least partially transparent intermediate layer is arranged on the first intermediate layer and covers the at least one optoelectronic fiber.

An essential aspect of the invention is to integrate an optoelectronic fiber, comprising a plurality of light sources or LEDs, to be manufactured independently of the laminated glass pane, into the thermoplastic intermediate layer between the two glass sheets of the laminated glass pane. For this purpose, the optoelectronic fiber can be manufactured in a separate manufacturing process in a cost-effective manner and then arranged on the first intermediate layer according to a desired pattern and integrated into the laminated glass pane accordingly. This makes it possible to integrate LEDs into a pane in a very cost-effective manner, while at the same time allowing a high degree of customization with regard to the arrangement of the optoelectronic fiber and the LEDs.

In some embodiments, the transparent pane is formed by a glass pane, but the transparent pane may also be formed of a transparent plastic such as Plexiglas or a transparent film. In some embodiments, the transparent pane is formed by a transparent, flexible film.

In some embodiments, the first and/or second at least partially transparent intermediate layer is formed by a melt material layer, an adhesive layer, a hot melt adhesive layer, a resin such as ethylene vinyl acetate (EVA), polyvinyl butyral (PVB), or by an ionomer-based system. In particular, the first and/or second at least partially transparent intermediate layer may comprise or consist of an at least partially transparent plastic, in particular an at least partially transparent film, in particular a flexible film. In some embodiments, the first and/or second at least partially transparent intermediate layer may be blackened.

In some embodiments, the at least one optoelectronic fiber is embedded between the first and second at least partially transparent intermediate layers. The first and second at least partially transparent intermediate layers may, for example, compensate for a height or topography of the at least one optoelectronic fiber.

In some embodiments, the at least one electrical line is configured to supply electrical power and/or a data signal to the plurality of optoelectronic semiconductor components. The at least one electrical line may be formed of a conductive material, such as copper. The at least one electrical line may be coated and/or blackened to reduce the reflectance of the outer surface region of the at least one electrical line. For example, the coating may be a palladium or molybdenum coating. In some embodiments, the at least one electrical line may have a width in the range between 5 µm and 50 µm. In particular, the width or cross-section of the at least one electrical line may be dependent on the length of the optoelectronic fiber and the electrical energy to be transmitted to power the optoelectronic semiconductor components.

In some embodiments, the at least one electrical conductor comprises a substantially transparent material, such as indium tin oxide (ITO). Such a material may, for example, increase the transparency of the optoelectronic fiber and thus increase the transparency of the optoelectronic lighting device.

In some embodiments, the optoelectronic fiber includes a flexible cover layer. The flexible cover layer is arranged on the flexible support substrate and embeds the at least one electrical line and the plurality of optoelectronic semiconductor components. For example, the flexible cover layer and the flexible support layer may enclose the at least one electrical line and the plurality of optoelectronic semiconductor components and provide mechanical stability to the at least one electrical line and the plurality of optoelectronic semiconductor components. Further, the flexible cover layer and the flexible support layer may protect the at least one electrical line and the plurality of optoelectronic semiconductor components from, for example, damage that may occur during further processing of the optoelectronic fiber.

In some embodiments, the flexible support substrate and/or the flexible cover layer comprises at least one of PVB, EVA, silicone, acrylic, and an epoxy. In particular, the flexible support substrate and/or the flexible cover layer may comprise a substantially transparent material that additionally exhibits flexible or elastic properties. In some embodiments, the flexible support substrate and the flexible cover layer comprise the same material.

The term "flexible" can be understood to mean that the flexible carrier substrate and/or the flexible cover layer is pliable or elastic and can be brought into a desired shape non-destructively and without the action of large forces.

In some embodiments, the material of the flexible support substrate and/or the material of the flexible cover layer have a refractive index substantially equal to the refractive index of the material of the first and/or the second intermediate layer. As a result, it is possible that a refractive index jump between the materials of the flexible support substrate and/or the flexible cover layer and the first and/or the second intermediate layer is reduced. This in turn can result in no or only hardly any light being refracted or reflected at the interfaces between the flexible carrier substrate and/or the flexible cover layer and the first and/or the second intermediate layer.

In some embodiments, the optoelectronic fiber has one of the following cross-sectional shapes as viewed transversely to the longitudinal direction: rectangular; square; round; oval; and trapezoidal. For example, a first portion of the cross-sectional area may be formed by the flexible support substrate and a second portion of the cross-sectional area may be formed by the flexible cover layer. The at least one electrical line and the plurality of optoelectronic semiconductor components may be arranged between the flexible carrier substrate and the flexible cover layer.

In some embodiments, a height and/or width or a diameter or radius of a cross-sectional area of the optoelectronic fiber is less than or equal to 200 µm and in particular less than or equal to 150 µm. With such a height, it is possible to integrate the optoelectronic fiber into the interconnection layer between two glass sheets, since the topography created by the at least one optoelectronic fiber can be compensated by the interconnection layer.

In some embodiments, a height of at least two intersecting optoelectronic fibers at their intersection point is less than or equal to 300 µm. With such a height, it is also possible to integrate multiple crossing optoelectronic fibers into the interconnect layer between two glass sheets, since the topography created by the multiple crossing optoelectronic fibers can be balanced by the interconnect layer.

In some embodiments, the optoelectronic fiber has a length of at least 1 m, in particular a length of at least 5 m. In particular, the optoelectronic fiber may be configured as a continuous fiber and have a particularly long length when viewed in the longitudinal direction. The optoelectronic fiber can, for example, be rolled up and processed in a manner similar to that of a conventional textile fiber and can therefore be particularly suitable for integration into the intermediate layer of a laminated glass pane.

In some embodiments, each of the plurality of optoelectronic semiconductor components is formed by a light emitting element or LED. In some embodiments, each of the luminous elements forms a luminous dot, wherein the totality of the luminous dots may form a luminous symbol or a luminous lettering during an intended use of the optoelectronic lighting device. On the other hand, the luminous points can also be arranged randomly with respect to one another and, for example, form a dot-shaped pattern. In this context, the term luminous point is not to be understood as a point-shaped element, but as an area of a defined luminous surface predetermined by the size of the semiconductor device.

In some embodiments, at least one of the plurality of optoelectronic semiconductor components may be formed by a light emitting element or LED comprising a conversion material. For example, the conversion material may be arranged on a light emitting region of the semiconductor device and may be configured to convert light emitted from the semiconductor device into light of a different wavelength.

In some embodiments, each of the plurality of optoelectronic semiconductor components is formed by an LED, in particular an LED chip. In particular, an LED may be referred to as a mini-LED, which is a small LED, for example, with edge lengths of less than 200 µm, in particular down to less than 40 µm, in particular in the range of 200 µm to 10 µm. Another range is between 150 µm to 40 µm. At these spatial extents, the optoelectronic semiconductor component is virtually invisible to the human eye.

The LED may also be referred to as a micro-LED, also known as a µLED, or a µLED chip, particularly in the case where the edge lengths are in the range of 100 µm to 10 µm. In some embodiments, the LED may have a spatial dimension of 90×150 µm or a spatial dimension of 75×125 µm.

In some embodiments, the mini-LED or µLED chip may be an unhoused semiconductor chip. Unhoused can mean that the chip does not have a package around its semiconductor layers, such as a "chip die." In some embodiments, unhoused may mean that the chip is free of any organic material. Thus, the unhoused device does not contain any organic compounds that contain carbon in a covalent bond.

In some embodiments, each of the plurality of optoelectronic semiconductor components may comprise a mini-LED or µLED chip configured to emit light of a selected color. In some embodiments, two or more of the plurality of optoelectronic semiconductor components may form a pixel, such as an RGB pixel comprising three mini-LEDs or µLED chips. For example, an RGB pixel may emit light of the colors red, green, and blue, as well as any mixed colors. In some embodiments, more than three of the plurality of optoelectronic semiconductor components may form a pixel, such as an RGBW pixel comprising four mini-LEDs or µLED chips. For example, an RGBW pixel can emit light of the colors red, green, blue, and white, as well as any mixed colors. For example, white light, or red light, or green light, or blue light can be generated by means of an RGBW pixel in the form of a full conversion.

In some embodiments, each of the plurality of optoelectronic semiconductor components is associated with an integrated circuit for driving the same. In some embodiments, 2 or more of each of the plurality of optoelectronic semiconductor components are associated with an integrated circuit for driving them. For example, one RGB pixel may be associated with each integrated circuit (IC). The integrated circuit(s) may, for example, be formed by a particularly small integrated circuit, such as a micro integrated circuit (µIC).

In some embodiments, a layer of light scattering particles may be arranged on each of the plurality of optoelectronic semiconductor components or on each pixel. The use of such a layer with the light scattering particles may in particular improve a homogeneous radiation of the light of the optoelectronic semiconductor components.

In some embodiments, the plurality of optoelectronic semiconductor components of an optoelectronic fiber are interconnected in the form of a parallel circuit. Compared to a series circuit, this can have the advantage that a single defective optoelectronic semiconductor component does not result in the further optoelectronic semiconductor components of the same optoelectronic fiber being unable to continue to operate.

In some embodiments, the plurality of optoelectronic semiconductor components of an optoelectronic fiber is interconnected in the form of a daisy chain interconnection. Daisy chain in this context can mean that the plurality of optoelectronic semiconductor components are controlled via a serial bus. For example, individual controllability of the optoelectronic semiconductor components can be achieved by connecting a plurality of optoelectronic semiconductor components in series with, for example, an integrated circuit (IC) assigned to each of the optoelectronic semiconductor components.

In some embodiments, each of the plurality of optoelectronic semiconductor components is formed by a light emitting element or LED. The plurality of light emitting elements forms a luminous symbol or lettering during an intended use of the optoelectronic lighting device. In the case of a plurality of optoelectronic fibers, the luminous elements of the individual optoelectronic fibers can collectively form a symbol or a luminous lettering during an intended use of the optoelectronic lighting device, or the luminous elements of the individual optoelectronic fibers can form several symbols or luminous letterings during an intended use of the optoelectronic lighting device.

In some embodiments, viewed in the longitudinal direction of the optoelectronic fiber, a distance between at least two adjacent optoelectronic semiconductor components is greater than or equal to 1 mm, greater than or equal to 1 cm, or greater than or equal to 2 cm. The plurality of optoelectronic semiconductor components can thus be integrated with a relatively large spacing from one another, for example greater than or equal to 2 cm, in a particularly cost-effective manner in a window, for example of a motor vehicle. The non-illuminated areas resulting from the large distance cause no or only minimal costs, since there are no semiconductor components or semiconductor substrates in these areas but only the intermediate layers.

In some embodiments, the optoelectronic lighting device comprises another transparent pane, in particular glass sheet, wherein the first and second intermediate layers are arranged between the two transparent panes, in particular glass sheets. The first and second intermediate layers may be formed, for example, by a thermoplastic bonding layer laminated between two glass sheets. Accordingly, the optoelectronic lighting device may form a laminated glass pane in which a plurality of lighting elements are integrated.

The invention also relates to a method of manufacturing an optoelectronic lighting device comprising the steps:
  Providing a transparent pane, especially a glass pane;
  Applying a first at least partially transparent intermediate layer to the transparent pane;
  Providing at least one optoelectronic fiber, the at least one optoelectronic fiber comprising at least one electrical line extending in a longitudinal direction and connected to a plurality of optoelectronic semiconductor components and a flexible support substrate;
  Arranging the at least one optoelectronic fiber on the first intermediate layer; and
  applying a second at least partially transparent intermediate layer to the first intermediate layer such that the second intermediate layer covers the first intermediate layer and the at least one optoelectronic fiber.

In some embodiments, the step of arranging the at least one optoelectronic fiber on the first intermediate layer is performed such that the at least one optoelectronic fiber or the plurality of optoelectronic semiconductor components form a symbol or lettering during operation of the optoelectronic semiconductor components. For this purpose, the at least one optoelectronic fiber can, for example, be pressed into the first intermediate layer in a corresponding arrangement or shape, or bonded to it, so that the plurality of optoelectronic semiconductor components form a symbol or lettering in the later intended operation of the optoelectronic semiconductor components.

In some embodiments, the method comprises a further step:
  arranging a further transparent pane, in particular glass pane, on the second intermediate layer in such a way that the first and second intermediate layers are arranged between the two transparent panes, in particular glass panes.

In some embodiments, the transparent pane, the first intermediate layer, the second intermediate layer, and the optional further transparent pane are bonded together in a further lamination step, in particular under the action of pressure and/or temperature.

In some embodiments, the step of providing the at least one optoelectronic fiber comprises a step of providing the flexible support substrate, a step of arranging at least one electrical line along the longitudinal direction on the flexible support substrate, and, a step of electrically connecting a plurality of optoelectronic semiconductor components to the at least one electrical line. Likewise, the optoelectronic semiconductor components may also be connected to the at least one electrical line in the form of an assembly, arranged individually or in a plurality on an integrated circuit.

In some embodiments, the step of providing the at least one optoelectronic fiber further comprises a step of arranging a flexible cover layer on the flexible support substrate. In this regard, the flexible cover layer is arranged on the flexible support substrate such that the at least one electrical line and the plurality of optoelectronic semiconductor components are at least partially embedded in the flexible cover layer.

BRIEF DESCRIPTION OF THE DRAWINGS

In the following, embodiments of the invention are explained in more detail with reference to the accompanying drawings. They show, schematically in each case, FIG. 1 the structure of a laminated glass pane.

DETAILED DESCRIPTION

The following embodiments and examples show various aspects and their combinations according to the proposed principle. The embodiments and examples are not always to scale. Likewise, various elements may be shown enlarged or reduced in size to highlight individual aspects. It will be understood that the individual aspects and features of the embodiments and examples shown in the figures may be readily combined with each other without affecting the principle of the invention. Some aspects have a regular structure or shape. It should be noted that minor deviations from the ideal shape may occur in practice, but without contradicting the inventive idea.

In addition, the individual figures, features and aspects are not necessarily shown in the correct size, nor do the proportions between the individual elements have to be fundamentally correct. Some aspects and features are highlighted by showing them enlarged. However, terms such as "above", "above", "below", "below", "larger", "smaller" and the like are correctly represented in relation to the elements in the figures. Thus, it is possible to derive such relationships between the elements based on the figures.

Figure 1:
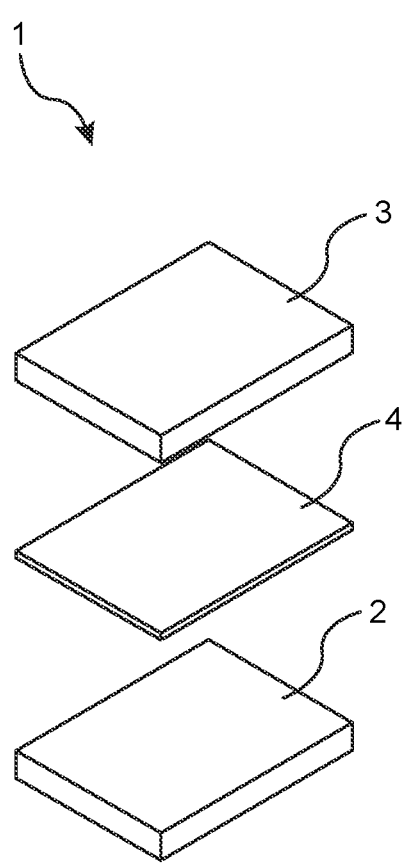

FIG. 1 shows the structure of a conventional laminated glass pane 1. The laminated glass pane 1 comprises a first glass pane 2 and a second glass pane 3, as well as a thermoplastic bonding layer 4 that mechanically bonds the two glass panes together. The laminated glass pane 1 can be produced, for example, by laminating the two glass panes together by means of the thermoplastic bonding layer 4.

Figure 2:
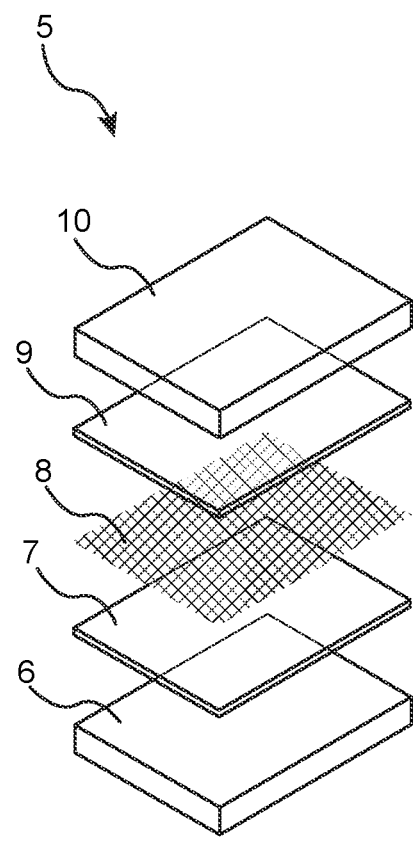
FIG. 2 the structure of an optoelectronic lighting device according to some aspects of the proposed principle.

FIG. 2 shows the structure of an optoelectronic lighting device according to some aspects of the proposed principle. The luminous device 5 comprises a transparent pane 6, in particular a glass pane, on which a first at least partially transparent intermediate layer 7 is arranged. Furthermore, the luminous device 5 comprises a network of optoelectronic fibers 8 arranged on the first intermediate layer 7. A second at least partially transparent intermediate layer 9 is arranged above the optoelectronic fibers 8, covering the optoelectronic fibers 8, and a further transparent pane 10, in particular a glass pane, is arranged above the second intermediate layer 9.

The composite of the layers or panes shown is mechanically connected to each other in that the two transparent panes 6, 10, can be laminated together through the two intermediate layers 7, 9, for example. Alternatively, the composite of the shown layers or panes can be glued together.

Figure 3:
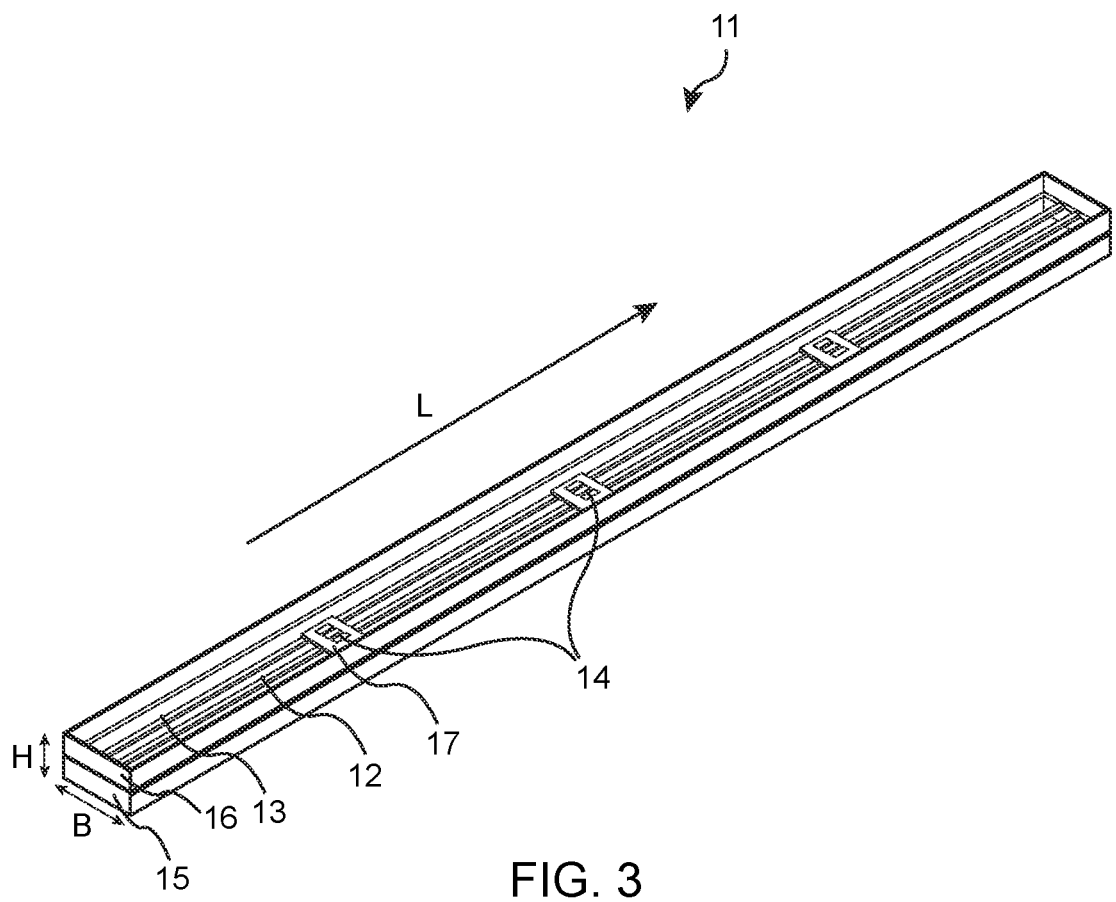
FIG. 3 the structure of an optoelectronic fiber according to some aspects of the proposed principle.

The network of optoelectronic fibers 8 may comprise one or more optoelectronic fibers 11 as shown in FIG. 3. The optoelectronic fiber 11 shown in FIG. 3 has first and second electrical lines 12, 13 extending in a longitudinal direction L of the optoelectronic fiber 11. Further, the optoelectronic fiber 11 has a plurality of optoelectronic semiconductor components 14 electrically connected to the two electrical lines 12, 13 and distributed along the longitudinal direction in the optoelectronic fiber 11.

In addition thereto, the optoelectronic fiber 11 has a flexible support substrate 15 on which the two electrical lines 12, 13 and the plurality of optoelectronic semiconductor components 14 are arranged, and a flexible cover layer 16 arranged on the flexible support substrate 15 and embedding the electrical lines 12, 13 and the plurality of optoelectronic semiconductor components 14.

The flexible support substrate 15 and the flexible cover layer 16 enclose the electrical lines 12, 13 and the plurality of optoelectronic semiconductor components 14 and provide the optoelectronic fiber 11 with a required mechanical stability. Further, the flexible covering layer 16 and the flexible substrate layer 15 can protect the electrical lines 12, 13 and the plurality of optoelectronic semiconductor components 14 from damage that may occur during further processing of the optoelectronic fiber 11.

For this purpose, the flexible carrier substrate 15 and the flexible cover layer 16 may comprise a substantially transparent material that additionally exhibits flexible or elastic properties. For example, the flexible carrier substrate 15 and the flexible cover layer 16 comprise a material such as PVB, EVA, silicone, acrylic, or an epoxy.

According to FIG. 3, three optoelectronic semiconductor components 14 are each arranged on an integrated circuit 17 to form a pixel. For example, the three optoelectronic semiconductor components 14 on an integrated circuit 17 may each form an RGB pixel.

Figure 4:
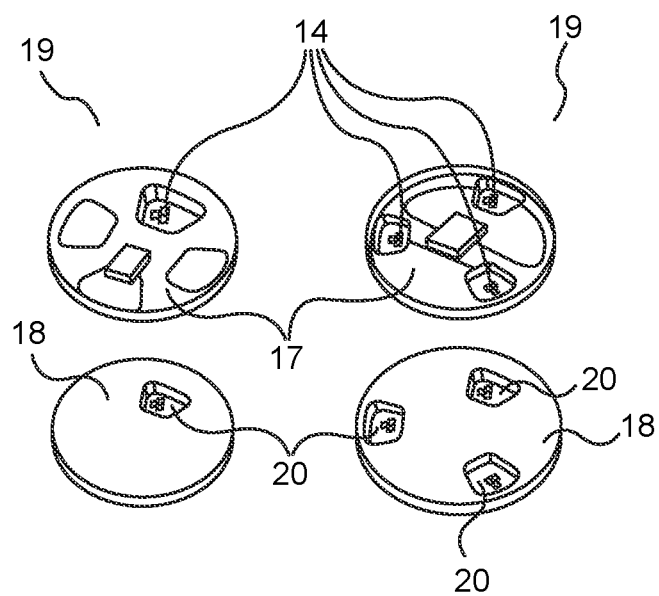
FIG. 4 an integrated circuit with one or three optoelectronic semiconductor components arranged thereon.

FIG. 4 shows two embodiments of a corresponding assembly 19 comprising integrated circuit 17 and semiconductor components 14 arranged thereon. The left side of the figure shows an integrated circuit 17 with an optoelectronic semiconductor component 14 arranged thereon, whereas the right side of the figure shows an integrated circuit 17 with three optoelectronic semiconductor components 14 arranged thereon. The two lower illustrations of the figure show an encapsulation 18 of the assembly 19 with a respective cavity 20 above the optoelectronic semiconductor components 14 so that the light of the optoelectronic semiconductor components 14 can be emitted from the assembly 19.

Seen transversely to the longitudinal direction L, the optoelectronic fiber 11 has a rectangular cross-section. The cross-sectional area is formed in a first part by the flexible carrier substrate 15 and in a second part by the flexible cover layer 16. Between the flexible carrier substrate 15 and the flexible cover layer 16 are arranged the one electrical lines 12, 13 and the plurality of optoelectronic semiconductor components 14 and also the integrated circuits 17.

The cross-sectional area has a height H and a width B. The height H is in particular less than or equal to 200 μm, or less than or equal to 150 μm and the width B is in particular less than or equal to 300 μm, or less than or equal to 200 μm. With such a height, it is possible to integrate the optoelectronic fiber 11 between the two intermediate layers 7,9 between the two transparent panes 6, 10, since the topography generated by the optoelectronic fiber 11 can be compensated by the two intermediate layers 7,9.

Figure 5:
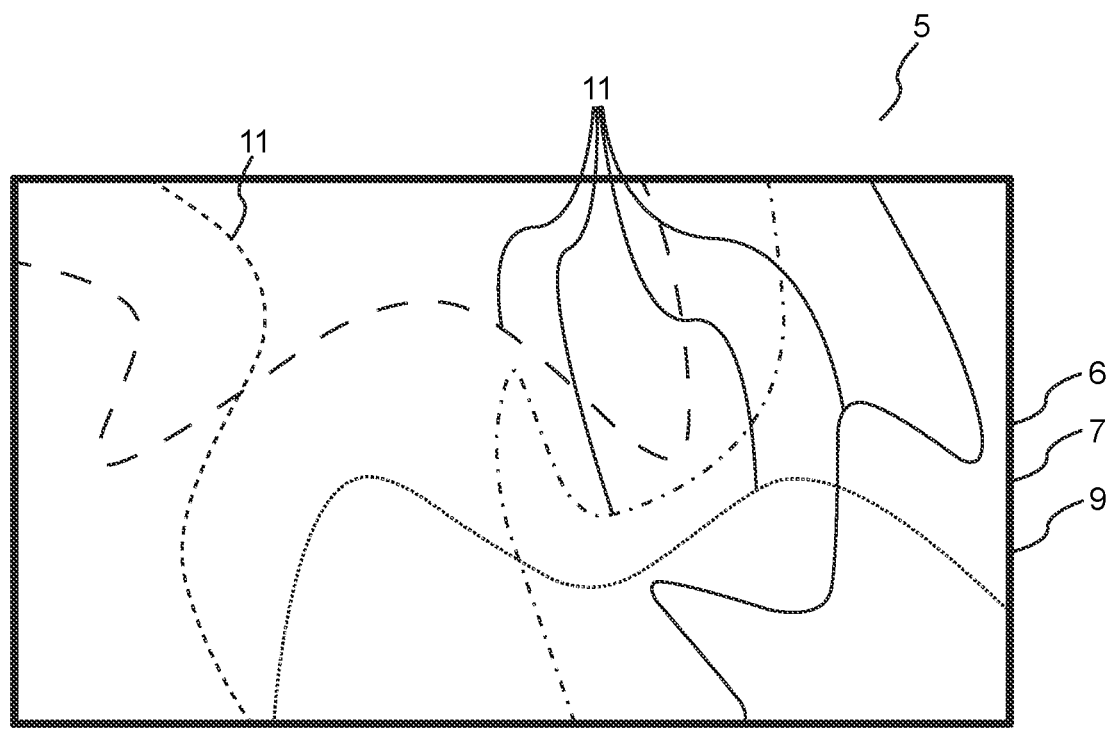
FIG. 5 a top view of an optoelectronic lighting device according to some aspects of the proposed principle.

FIG. 5 shows a top view of an optoelectronic lighting device 5 according to some aspects of the proposed principle. The optoelectronic lighting device 5 has a plurality of optoelectronic fibers 11 arranged between the two intermediate layers 7,9. Exemplary optoelectronic fibers 11 are shown in FIG. 5.

The optoelectronic fibers 11 can be arranged between the two intermediate layers 7,9 in such a way that at least a subset of the plurality of optoelectronic semiconductor components 14 forms a luminous symbol or a luminous lettering during an intended use of the optoelectronic lighting device 5. Likewise, however, all of the plurality of optoelectronic semiconductor components 14 can also collectively form a symbol or illuminated lettering during an intended use of the optoelectronic lighting device 5. Alternatively, or in addition thereto, at least some of the optoelectronic semiconductor components 14 may be arranged randomly with respect to each other and form, for example, a dot-shaped pattern during an intended use of the optoelectronic lighting device 5.

REFERENCE LIST 1 laminated glass pane
2 first glass pane
3 second glass pane
4 thermoplastic compound layer
5 optoelectronic lighting device
6 transparent pane
7 first at least partially transparent intermediate layer
8 net of optoelectronic fibers
9 second at least partially transparent intermediate layer
10 further transparent pane
11 optoelectronic fiber
12 first electrical line
13 second electrical line
14 optoelectronic semiconductor component
15 flexible support substrate
16 flexible cover layer
17 integrated circuit
18 encapsulation
19 Assembly
Cavity
L Longitudinal direction
H Height
B Width

The invention claimed is:

1. An optoelectronic lighting device comprising:
a transparent pane on which a first at least partially transparent intermediate layer is arranged;
at least one optoelectronic fiber arranged on the first intermediate layer and comprising at least one electrical line extending in a longitudinal direction and connected to a plurality of optoelectronic semiconductor components, wherein the optoelectronic fiber comprises a flexible support substrate on which the at least one electrical line and the plurality of optoelectronic semiconductor components are arranged; and
a second at least partially transparent intermediate layer, the second intermediate layer being arranged on the first intermediate layer and covering the at least one optoelectronic fiber.

2. The optoelectronic lighting device according to claim 1, wherein the at least one electrical line is blackened or comprises a substantially transparent material.

3. The optoelectronic lighting device according to claim 1, wherein the optoelectronic fiber comprises a flexible cover layer arranged on the flexible support substrate, and the flexible cover layer embeds the at least one electrical line and the plurality of optoelectronic semiconductor components.

4. The optoelectronic lighting device according to claim 1, wherein the flexible support substrate and/or the flexible cover layer comprises at least one of PVB, EVA, silicone, acrylic, and an epoxy, and wherein optionally the flexible support substrate and the flexible cover layer have the same material.

5. The optoelectronic lighting device according to claim 1, wherein the material of the flexible support substrate and/or the material of the flexible cover layer has a refractive index substantially corresponding to the refractive index of the material of the first and/or the second intermediate layer.

6. The optoelectronic lighting device according to claim 1, wherein the optoelectronic fiber has one of the following cross-sectional shapes as viewed transversely to the longitudinal direction:
rectangular;
square;
round;
oval; and
trapezoidal.

7. The optoelectronic lighting device according to claim 1, wherein a height and/or width or a diameter or radius of a cross-sectional area of the optoelectronic fiber is less than or equal to 200 μm.

8. The optoelectronic lighting device according to claim 1, wherein the optoelectronic fiber has a length of at least 1 m.

9. The optoelectronic lighting device according to claim 1, wherein each of the plurality of optoelectronic semiconductor components is associated with an integrated circuit for driving it, or,
wherein in each case two or more of the plurality of optoelectronic semiconductor components are associated with an integrated circuit for driving them.

10. The optoelectronic lighting device according to claim 1, wherein the plurality of optoelectronic semiconductor components are connected to each other in the form of a parallel circuit.

11. The optoelectronic lighting device according to claim 1, wherein the plurality of optoelectronic semiconductor components are interconnected in the form of a daisy chain circuit.

12. The optoelectronic lighting device according to claim 1,
wherein the at least one optoelectronic fiber or the plurality of optoelectronic semiconductor components form a symbol or lettering during operation of the optoelectronic semiconductor components.

13. The optoelectronic lighting device according to claim 1,
further comprising a further transparent pane, the first and second intermediate layers being arranged between the two transparent panes.

14. The optoelectronic lighting device according to claim 1,
wherein a height of at least two intersecting optoelectronic fibers at their intersection point is less than or equal to 300 um.

15. The optoelectronic lighting device according to claim 1,
wherein when viewed in the longitudinal direction a distance between at least two adjacent optoelectronic semiconductor components is greater than or equal to 1 mm.

16. A method of manufacturing an optoelectronic lighting device comprising the steps:
providing a transparent pane;
applying a first at least partially transparent intermediate layer on the transparent pane;
providing at least one optoelectronic fiber, wherein the at least one optoelectronic fiber comprises at least one electrical line extending in a longitudinal direction and connected to a plurality of optoelectronic semiconductor components and a flexible support substrate;
arranging the at least one optoelectronic fiber on the first intermediate layer; and
applying a second at least partially transparent intermediate layer on the first intermediate layer such that the second intermediate layer covers the first intermediate layer and the at least one optoelectronic fiber.

17. The method according to claim 16,
wherein the step of arranging the at least one optoelectronic fiber on the first intermediate layer is performed such that the at least one optoelectronic fiber or the plurality of optoelectronic semiconductor components form a symbol or lettering during operation of the optoelectronic semiconductor components.

18. The method according to claim 16,
further comprising an arrangement of a further transparent pane on the second intermediate layer in such a way that the first and the second intermediate layer are arranged between the two transparent panes.

19. The method according to claim 16,
further comprising a lamination step in which the transparent pane, the first intermediate layer, the second intermediate layer and optionally another transparent pane are bonded together.

20. The method according to claim 16,
wherein the step of providing the at least one optoelectronic fiber comprises a step of providing the flexible support substrate, a step of arranging at least one electrical line along the longitudinal direction on the flexible support substrate, and, a step of electrically connecting a plurality of optoelectronic semiconductor components to the at least one electrical line; and
wherein optionally the step of providing the at least one optoelectronic fiber further comprises a step of arranging a flexible cover layer on the flexible support substrate such that the at least one electrical line and the plurality of optoelectronic semiconductor components are at least partially embedded in the flexible cover layer.

* * * * *